United States Patent
Zeng et al.

(10) Patent No.: US 9,142,807 B2
(45) Date of Patent: Sep. 22, 2015

(54) METHOD FOR MANUFACTURING FLEXIBLE OLED (ORGANIC LIGHT EMITTING DISPLAY) PANEL

(71) Applicant: Shenzhen China Star Optoelectronics Technology Co., Ltd., Shenzhen, Guangdong (CN)

(72) Inventors: Weijing Zeng, Shenzhen (CN); Chihche Liu, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 38 days.

(21) Appl. No.: 14/241,071

(22) PCT Filed: Jan. 13, 2014

(86) PCT No.: PCT/CN2014/070550
§ 371 (c)(1),
(2) Date: Feb. 25, 2014

(65) Prior Publication Data
US 2015/0188096 A1 Jul. 2, 2015

(51) Int. Cl.
*H01L 21/00* (2006.01)
*H01L 51/56* (2006.01)
*H01L 51/00* (2006.01)

(52) U.S. Cl.
CPC .............. *H01L 51/56* (2013.01); *H01L 51/003* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 6,322,655 B1* | 11/2001 | Casagrande | | 156/257 |
| 7,202,932 B2* | 4/2007 | Niwa et al. | | 349/154 |
| 8,030,178 B2* | 10/2011 | Aoki et al. | | 438/458 |
| 8,300,202 B2* | 10/2012 | Tanaka | | 349/156 |
| 8,323,066 B2* | 12/2012 | Kim | | 445/25 |
| 8,835,201 B2* | 9/2014 | Park et al. | | 438/29 |
| 2012/0118478 A1 | 5/2012 | Park et al. | | |
| 2012/0318771 A1* | 12/2012 | Guo et al. | | 216/20 |
| 2013/0300971 A1* | 11/2013 | Lee et al. | | 349/58 |
| 2014/0054553 A1* | 2/2014 | Liu | | 257/40 |
| 2014/0065916 A1* | 3/2014 | Lee et al. | | 445/25 |
| 2014/0120639 A1* | 5/2014 | Park et al. | | 438/22 |
| 2014/0329342 A1* | 11/2014 | Zeng | | 438/15 |
| 2014/0353594 A1* | 12/2014 | Zeng | | 257/40 |

FOREIGN PATENT DOCUMENTS

| | | |
|---|---|---|
| CN | 102468452 A | 5/2012 |
| CN | 102651331 A | 8/2012 |
| CN | 103337478 A | 10/2013 |
| CN | 103456900 A | 12/2013 |

(Continued)

*Primary Examiner* — David E Graybill
(74) *Attorney, Agent, or Firm* — Andrew C. Cheng (57) ABSTRACT

The present invention provides a method for manufacturing an OLED panel. The method is simple and fixes a first substrate and a flexible material layer together by forming a support layer on the first substrate and forming, through etching, a groove in the support layer and coating UV resin in the groove so as to obtain a flexible material layer that is flat, operable, and not prone to deformation. After the formation of an OLED element, the portion outside an area delimited by the groove is trimmed off and the first substrate and the flexible material layer are separated to obtain a flexible OLED panel. This method allows for automation and does not cause damage to the components.

13 Claims, 6 Drawing Sheets

(56) References Cited

FOREIGN PATENT DOCUMENTS

| JP | 2007240914 | A | * | 9/2007 |
| JP | 2013120352 | A | * | 6/2013 |
| WO | WO 2014201759 | A1 | * | 12/2014 |

* cited by examiner

METHOD FOR MANUFACTURING FLEXIBLE OLED (ORGANIC LIGHT EMITTING DISPLAY) PANEL

BACKGROUND OF THE INVENTION

1. Field of the Invention

The present invention relates to the field of flat panel displaying, and in particular to a method for manufacturing a flexible OLED (Organic Light Emitting Display) panel.

2. The Related Arts

A flat panel display device has various advantages, such as thin device body, low power consumption, and being free of radiation, and is thus of wide applications. The flat panel display devices that are currently available include liquid crystal displays (LCDs) and organic light emitting displays (OLEDs).

The organic light emitting displays have characteristics of self luminescence, high brightness, wide view angle, high contrast, flexibility, and low power consumption and thus get wide attentions for serving as next generation displaying measures used in electronic products, such as mobile phone screens, computer displays, and full color televisions to replace the traditional liquid crystal displays. The OLED displaying technology, which is different the conventional LCD displaying technology, requires no backlighting and instead uses extremely thin organic material coating and glass substrate, whereby when an electrical current flowing therethrough, the organic material emits light.

The development of the OLED displaying technology brings flexible OLED displaying technology a new hot spot of the display panel business. However, since a flexible substrate is prone to deformation, the operations of a manufacturing process are hard to achieve, particularly alignment, film formation of TFT (Thin-Film Transistor) or OLED.

SUMMARY OF THE INVENTION

An object of the present invention is to provide a method for manufacturing a flexible OLED (Organic Light Emitting Display) panel, which is simple, can be automatized, does not cause damage of components, and can effectively handle the problem of a flexible substrate being prone to deformation that leads to difficult operations of the manufacture.

To achieve the above objects, the present invention provides a method for manufacturing an OLED panel, which comprises the following steps:

(1) providing a first substrate and forming a support layer on the first substrate;
(2) etching a circumferential edge of the support layer to form a groove and coating UV resin in the groove;
(3) providing a second substrate and a flexible material and laying the flexible material on the second substrate for being attached thereto through vacuum suction in order to form a flexible material layer;
(4) in a vacuum condition, aligning and laminating the first substrate and the second substrate together in such a way that the flexible material layer of the second substrate faces the support layer of the first substrate and subjecting the UV resin to irradiation of ultraviolet ray for curing that the flexible material layer is fixedly attached to the support layer and then removing the second substrate;
(5) sequentially forming a TFT (Thin-Film Transistor) element and an OLED element on the flexible material layer in an area corresponding to that delimiting by inside edges of the groove and forming a package layer on the OLED element to package the OLED element; and
(6) trimming off an area outside the area delimited by the inside edges of the groove and separating the first substrate and the support layer from the flexible material layer, the TFT element, the OLED element, and the package layer to obtain a flexible OLED panel.

The first substrate is a glass substrate.

The support layer is made of silicon nitride or silicon dioxide.

The UV resin has a thickness greater than depth of the groove.

In step (2), the etching is an acid etching process or a dry etching process.

The second substrate is a glass substrate.

In step (3), the flexible material is laid flat and attached via vacuum suction to the second substrate by being rolled and pressed by a roller.

The OLED element comprises an anode, an organic material layer formed on the anode, and a cathode formed on the organic material layer.

The present invention also provides a method for manufacturing an OLED panel, which comprises the following steps:

(1) providing a first substrate and forming a support layer on the first substrate;
(2) etching a circumferential edge of the support layer to form a groove and coating UV resin in the groove;
(3) providing a second substrate and a flexible material and laying the flexible material on the second substrate for being attached thereto through vacuum suction in order to form a flexible material layer;
(4) in a vacuum condition, aligning and laminating the first substrate and the second substrate together in such a way that the flexible material layer of the second substrate faces the support layer of the first substrate and subjecting the UV resin to irradiation of ultraviolet ray for curing that the flexible material layer is fixedly attached to the support layer and then removing the second substrate;
(5) sequentially forming a TFT (Thin-Film Transistor) element and an OLED element on the flexible material layer in an area corresponding to that delimiting by inside edges of the groove and forming a package layer on the OLED element to package the OLED element; and
(6) trimming off an area outside the area delimited by the inside edges of the groove and separating the first substrate and the support layer from the flexible material layer, the TFT element, the OLED element, and the package layer to obtain a flexible OLED panel;

wherein the first substrate is a glass substrate;

wherein the support layer is made of silicon nitride or silicon dioxide; and wherein the UV resin has a thickness greater than depth of the groove.

In step (2), the etching is an acid etching process or a dry etching process.

The second substrate is a glass substrate.

In step (3), the flexible material is laid flat and attached via vacuum suction to the second substrate by being rolled and pressed by a roller.

The OLED element comprises an anode, an organic material layer formed on the anode, and a cathode formed on the organic material layer.

The efficacy of the present invention is that the present invention provides a method for manufacturing an OLED panel, which is simple and which fixes a first substrate and a flexible material layer together by forming a support layer on the first substrate and forming, through etching, a groove in the support layer and coating UV resin in the groove so as to obtain a flexible material layer that is flat, operable, and not prone to deformation. After the formation of an OLED element, the portion outside an area delimited by the groove is trimmed off and the first substrate and the flexible material layer are separated to obtain a flexible OLED panel. This method allows for automation and does not cause damage to the components.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings:

FIGS. 2-9B illustrates the process of the method for manufacturing an OLED panel according to the present invention.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIGS. 1-9B, the present invention provides a method for manufacturing an OLED (Organic Light Emitting Display) panel, which comprises the following steps:

Step 1: providing a first substrate 20 and forming a support layer 22 on the first substrate 20.

The first substrate 20 can be a glass substrate or a plastic substrate. In the instant embodiment, the first substrate 20 is preferably a glass substrate. The support layer 22 is formed of silicon nitride (SiNx) or silicon dioxide ($SiO_2$).

Step 2: etching a circumferential edge of the support layer 22 to form a groove 24 and coating UV resin 26 in the groove 24.

Figure 1:
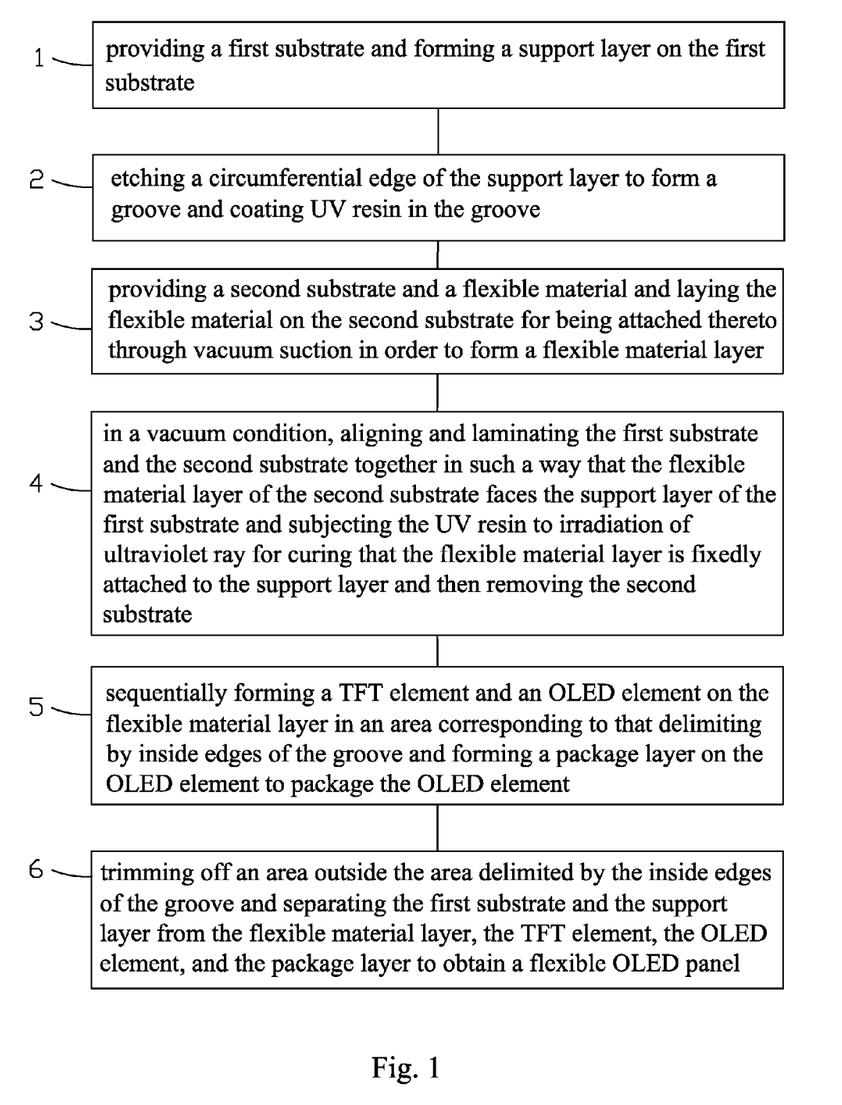
FIG. 1 is a flow chart illustrating a method for manufacturing a flexible OLED (Organic Light Emitting Display) panel according to the present invention.
Figure 2:
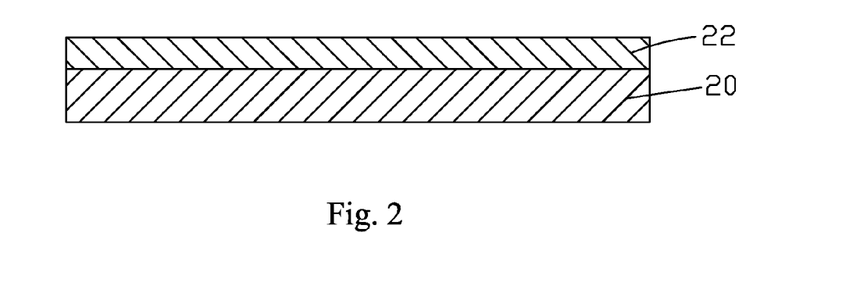
Figure 3A:
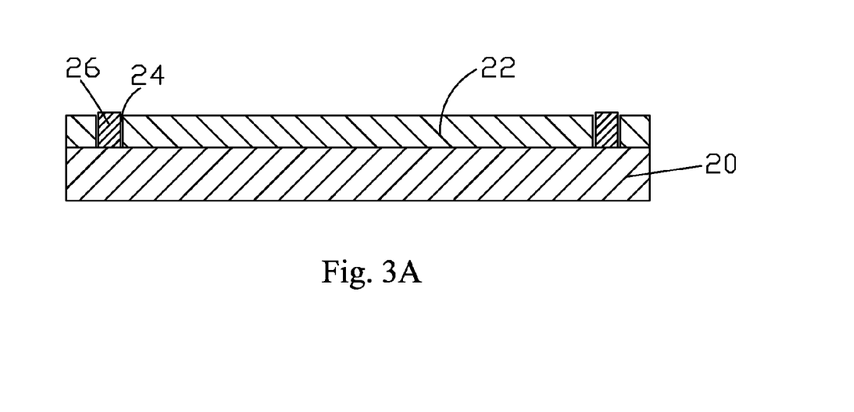
Figure 3B:
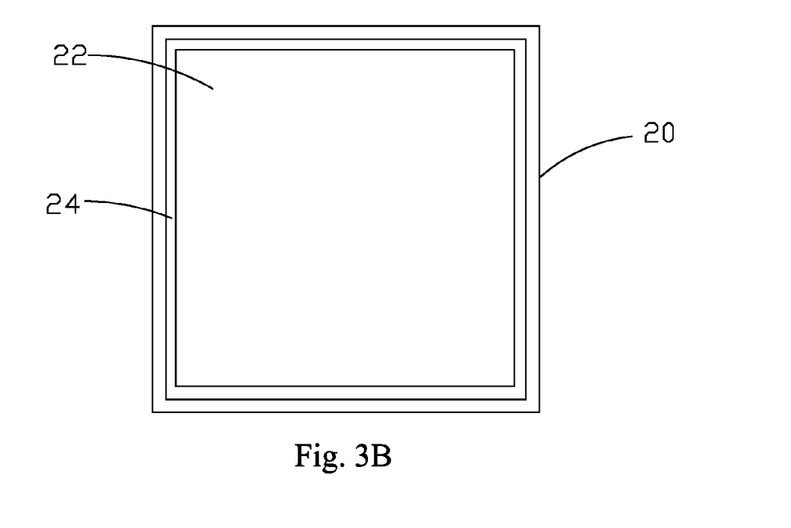

The etching used can be an acid etching process or a dry etching process. The UV resin 26 has a thickness slightly greater than depth of the groove 24, as illustrated in FIGS. 3A and 3B, wherein FIG. 3B is a top plan view of FIG. 3A.

Step 3: providing a second substrate 28 and a flexible material and laying the flexible material on the second substrate 28 for being attached thereto through vacuum suction in order to form a flexible material layer 30.

Figure 4A:
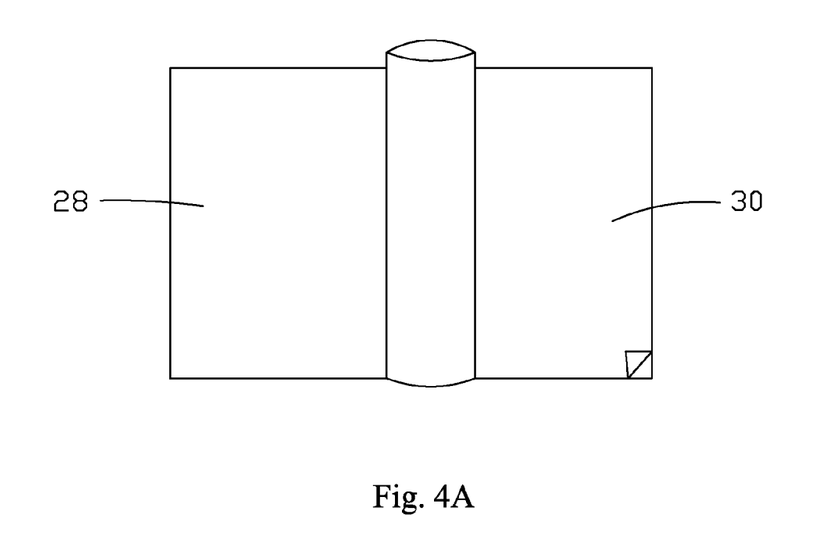
Figure 4B:
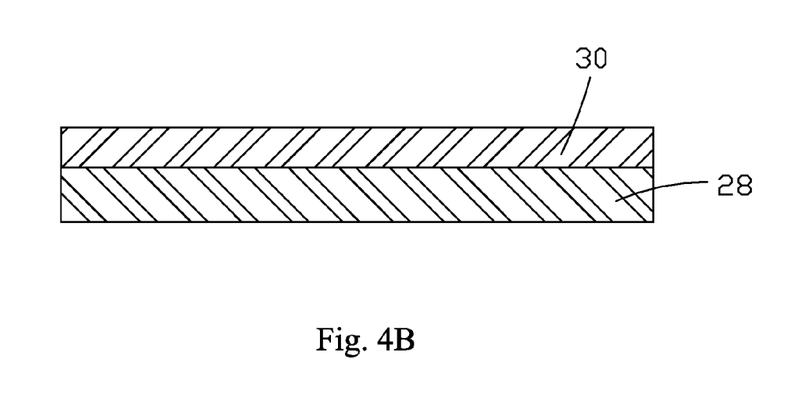
Figure 5:
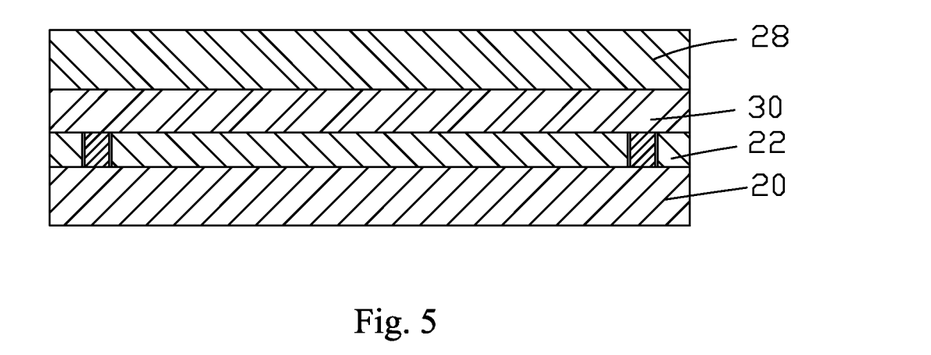
Figure 6:
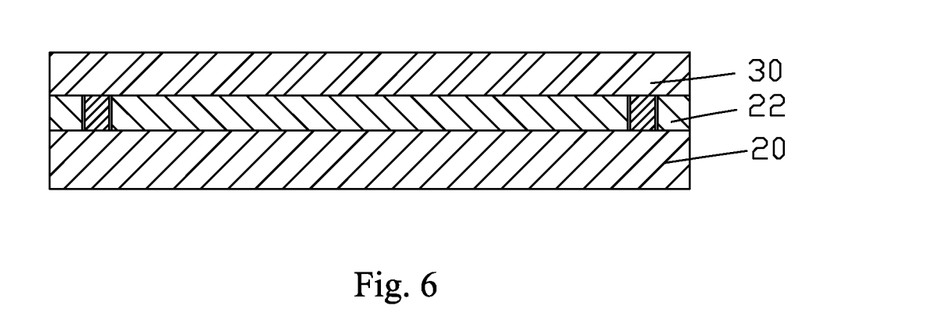
Figure 7:
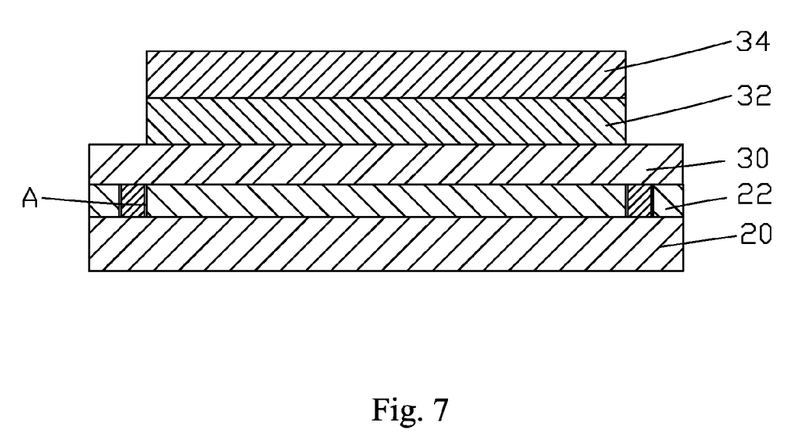
Figure 8:
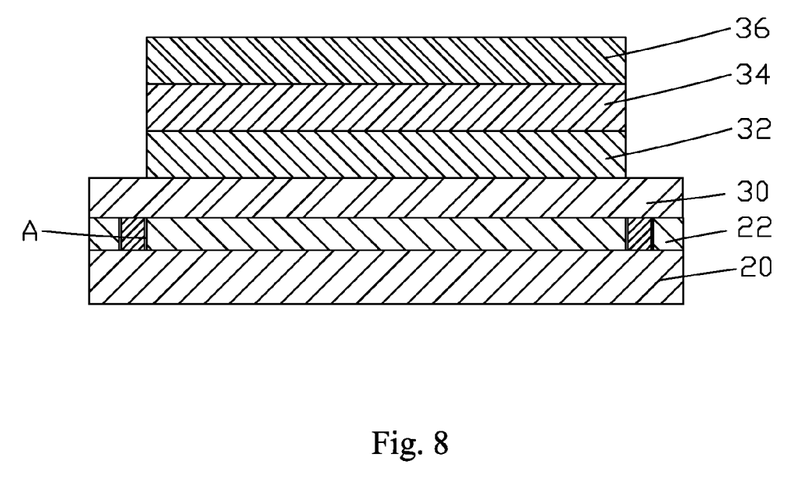

In the step, the flexible material is laid flat and attached via vacuum suction to the second substrate 28 (as shown in FIG. 4A) by being rolled and pressed by a roller.

Step 4: in a vacuum condition, aligning and laminating the first substrate 20 and the second substrate 28 together in such a way that the flexible material layer 30 of the second substrate 28 faces the support layer 22 of the first substrate 20 and subjecting the UV resin 26 to irradiation of ultraviolet ray for curing so that the flexible material layer 30 is fixedly attached to the support layer 22 and then removing the second substrate 28.

The flexible material layer 30 that is obtained after the step is a flexible substrate to be obtained. Since the flexible substrate has been fixed to a top side of the support layer 22 of the first substrate 20 by the UV resin, the flexible substrate is flat and is not susceptible to deformation so that operations can be easily carried out in a manufacturing process.

Step 5: sequentially forming a TFT (Thin-Film Transistor) element 32 and an OLED element 34 on the flexible material layer 30 in an area corresponding to that delimiting by inside edges A of the groove 24 and forming a package layer 36 on the OLED element 34 to package the OLED element 34.

The OLED element 34 comprising an anode, an organic material layer formed on the anode, and a cathode formed on the organic material layer.

The package layer 36 is a thin film.

Step 6: trimming off an area outside the area delimited by the inside edges A of the groove 24 and separating the first substrate 20 and the support layer 22 from the flexible material layer 30, the TFT element 32, the OLED element 34, and the package layer 36 to obtain a flexible OLED panel.

Figure 9A:
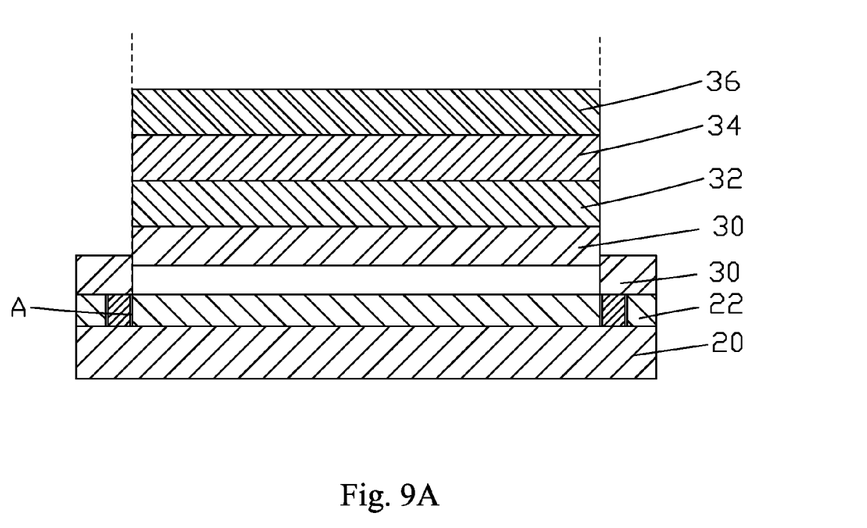
Figure 9B:
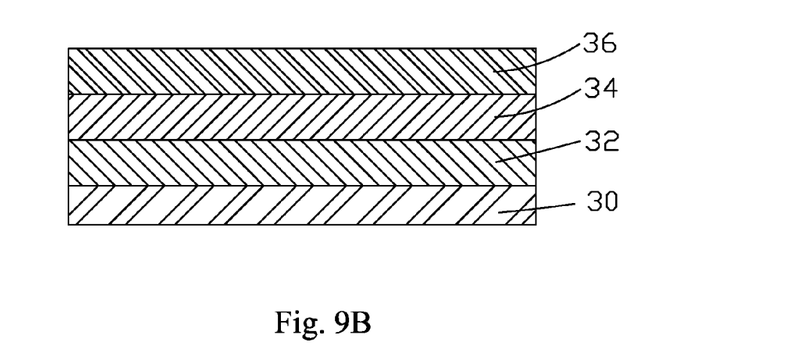

The portion so separated is a flexible OLED panel, as shown in FIG. 9B.

In summary, the present invention provides a method for manufacturing an OLED panel, which is simple and which fixes a first substrate and a flexible material layer together by forming a support layer on the first substrate and forming, through etching, a groove in the support layer and coating UV resin in the groove so as to obtain a flexible material layer that is flat, operable, and not prone to deformation. After the formation of an OLED element, the portion outside an area delimited by the groove is trimmed off and the first substrate and the flexible material layer are separated to obtain a flexible OLED panel. This method allows for automation and does not cause damage to the components.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an OLED (Organic Light Emitting Display) panel, comprising the following steps:
   (1) providing a first substrate and forming a support layer on the first substrate;
   (2) etching a circumferential edge of the support layer to form a groove and coating UV resin in the groove;
   (3) providing a second substrate and a flexible material and laying the flexible material on the second substrate for being attached thereto through vacuum suction in order to form a flexible material layer;
   (4) in a vacuum condition, aligning and laminating the first substrate and the second substrate together in such a way that the flexible material layer of the second substrate faces the support layer of the first substrate and subjecting the UV resin to irradiation of ultraviolet ray for curing that the flexible material layer is fixedly attached to the support layer and then removing the second substrate;
   (5) sequentially forming a TFT (Thin-Film Transistor) element and an OLED element on the flexible material layer in an area corresponding to that delimiting by inside edges of the groove and forming a package layer on the OLED element to package the OLED element; and (6) trimming off an area outside the area delimited by the inside edges of the groove and separating the first substrate and the support layer from the flexible material layer, the TFT element, the OLED element, and the package layer to obtain a flexible OLED panel.

2. The method for manufacturing the OLED panel as claimed in claim 1, wherein the first substrate is a glass substrate.

3. The method for manufacturing the OLED panel as claimed in claim 1, wherein the support layer is made of silicon nitride or silicon dioxide.

4. The method for manufacturing the OLED panel as claimed in claim 1, wherein the UV resin has a thickness greater than depth of the groove.

5. The method for manufacturing the OLED panel as claimed in claim 1, wherein in step (2), the etching is an acid etching process or a dry etching process.

6. The method for manufacturing the OLED panel as claimed in claim 1, wherein the second substrate is a glass substrate.

7. The method for manufacturing the OLED panel as claimed in claim 1, wherein in step (3), the flexible material is laid flat and attached via vacuum suction to the second substrate by being rolled and pressed by a roller.

8. The method for manufacturing the OLED panel as claimed in claim 1, wherein the OLED element comprises an anode, an organic material layer formed on the anode, and a cathode formed on the organic material layer.

9. A method for manufacturing an OLED (Organic Light Emitting Display) panel, comprising the following steps:

(1) providing a first substrate and forming a support layer on the first substrate;

(2) etching a circumferential edge of the support layer to form a groove and coating UV resin in the groove;

(3) providing a second substrate and a flexible material and laying the flexible material on the second substrate for being attached thereto through vacuum suction in order to form a flexible material layer;

(4) in a vacuum condition, aligning and laminating the first substrate and the second substrate together in such a way that the flexible material layer of the second substrate faces the support layer of the first substrate and subjecting the UV resin to irradiation of ultraviolet ray for curing that the flexible material layer is fixedly attached to the support layer and then removing the second substrate;

(5) sequentially forming a TFT (Thin-Film Transistor) element and an OLED element on the flexible material layer in an area corresponding to that delimiting by inside edges of the groove and forming a package layer on the OLED element to package the OLED element; and (6) trimming off an area outside the area delimited by the inside edges of the groove and separating the first substrate and the support layer from the flexible material layer, the TFT element, the OLED element, and the package layer to obtain a flexible OLED panel;

wherein the first substrate is a glass substrate;

wherein the support layer is made of silicon nitride or silicon dioxide; and wherein the UV resin has a thickness greater than depth of the groove.

10. The method for manufacturing the OLED panel as claimed in claim 9, wherein in step (2), the etching is an acid etching process or a dry etching process.

11. The method for manufacturing the OLED panel as claimed in claim 9, wherein the second substrate is a glass substrate.

12. The method for manufacturing the OLED panel as claimed in claim 9, wherein in step (3), the flexible material is laid flat and attached via vacuum suction to the second substrate by being rolled and pressed by a roller.

13. The method for manufacturing the OLED panel as claimed in claim 9, wherein the OLED element comprises an anode, an organic material layer formed on the anode, and a cathode formed on the organic material layer.

* * * * *